United States Patent [19]
Shimizu et al.

[11] Patent Number: 6,088,583
[45] Date of Patent: Jul. 11, 2000

[54] AUTOMATIC GAIN CONTROL CIRCUIT

[75] Inventors: Masahiko Shimizu; Hideto Furukawa; Tomonori Sato; Koji Matsuyama; Masaaki Fujii, all of Kawasaki, Japan

[73] Assignee: Fujitsu Limited, Kanagawa, Japan

[21] Appl. No.: 09/120,076

[22] Filed: Jul. 21, 1998

[30] Foreign Application Priority Data

Feb. 2, 1998 [JP] Japan .................................. 10-020738

[51] Int. Cl.$^7$ ...................................................... H04B 1/06
[52] U.S. Cl. ..................................... 455/235.1; 455/241.1; 455/244.1; 375/345
[58] Field of Search ............................. 455/234.1, 234.2, 455/235.1, 241.1, 242.1, 242.2, 244.1, 245.1, 245.2, 247.1, 250.1; 330/279, 280, 281; 375/345

[56] References Cited

U.S. PATENT DOCUMENTS 5,564,092 10/1996 Grandfield ........................... 455/235.1
5,697,081 12/1997 Lyale, Jr. ............................. 455/234.1

Primary Examiner—Thanh Cong Le
Attorney, Agent, or Firm—Helfgott & Karas, PC.

[57] ABSTRACT

In an automatic gain control (AGC) circuit for controlling a preceding gain control unit and a following gain control unit, the AGC circuit according to the present invention includes at least a comparison unit, a first gain control signal output unit and a second gain control signal output unit. The comparison unit compares a signal level from the following gain control unit with a reference value. The first gain control signal output unit outputs a first gain control signal to the following gain control unit in response to an output signal obtained as a result of comparison in the comparison unit. The second gain control signal output unit outputs a second gain control signal to the preceding gain control unit. Further, the second gain control signal has a time constant longer than that of the first gain control signal output unit, in response to the output signal obtained as the result of comparison in the comparison unit.

6 Claims, 8 Drawing Sheets

AUTOMATIC GAIN CONTROL CIRCUIT

BACKGROUND OF THE INVENTION

1. Field of the Invention

The present invention relates to an automatic gain control circuit for automatically controlling a gain of a gain control unit (below, preceding gain control unit) provided in a high frequency unit and the gain of a gain control unit (below, following gain control unit) provided in a low frequency unit. The present invention is advantageously applied to a wireless apparatus operated by a space diversity reception system with a CDMA (Code Division Multiple Access) method.

2. Description of the Related Art

As is known, in a wireless apparatus, a signal level at the reception of a receiver always fluctuates in the relatively large amplitude. This is because the propagation characteristics of radio wave fluctuates in accordance with the various propagation paths of the radio wave. In order to solve the problem of the fluctuation of the signal level at the reception of the receiver, an automatic gain control (AGC) circuit is usually provided in the wireless apparatus for amplifying or attenuating the signal level at the reception of the receiver to a necessary level. However, in general, conventional AGC circuits have large and complicated structures because two AGC circuits each having similar circuit structure are provided in the preceding and following gain control units. Accordingly, it is desired to simplify the structure of the AGC circuit.

SUMMARY OF THE INVENTION

The object of the present invention is to provide an automatic gain control circuit having simplified circuit structure.

In accordance with the present invention, there is provided an automatic gain control circuit for controlling a preceding gain control unit and a following gain control unit, the circuit including: a comparison unit for comparing a signal level from the following gain control unit with a reference value; a first gain control signal output unit for outputting a first gain control signal to the following gain control unit in response to an output signal obtained as a result of comparison in the comparison unit; and a second gain control signal output unit for outputting a second gain control signal to the preceding gain control unit, and the second gain control signal having a time constant longer than that of the first gain control signal output unit, in response to the output signal obtained as the result of comparison in the comparison unit.

In a preferred embodiment, the second gain control signal output unit comprises an up-down counter for controlling up and down count operations, in response to a result of comparison of a setting value with said output signal obtained as the result of comparison in the comparison unit, and for outputting the second gain control signal to the preceding gain control unit in response to values counted by the up-down counter.

In another preferred embodiment, the second gain control signal output unit further comprises an additional counter and a comparison and decision unit; the additional counter outputting an up count signal from the up-down counter when the additional counter is overflow, and outputting a down-count signal from the up-down counter when the additional counter is underflow; and the comparison and decision unit outputting the up count signal or down-count signal of the additional counter in response to the output signal from the comparison and decision unit, the setting value and the values counted by the up-down counter.

In still another preferred embodiment, the automatic gain control circuit further includes a fluctuation correcting unit for controlling so as to suppress the change in the first gain control signal from the first gain control signal output unit, the change being based on a result of gain control for the preceding gain control unit in response to the counted value in the up-down counter when the counted value in the up-down counter is changed.

In still another preferred embodiment, the following gain control unit provided for each branch is controlled by the first gain control signal from the first gain control signal output unit provided for each branch, and the preceding gain control unit provided for each branch is controlled by the second gain control signal from the second gain control signal output unit provided in common for a plurality of branches.

In still another preferred embodiment, either the first gain control signal output unit or the second gain control signal output unit controls each of or both the preceding and the following gain control units in such a way that a difference of the gain between the plurality of branches becomes a power of 2.

DESCRIPTION OF THE PREFERRED EMBODIMENTS

Before a description of the preferred embodiments is given, a conventional art and its problem will be explained in detail below.

Figure 8:
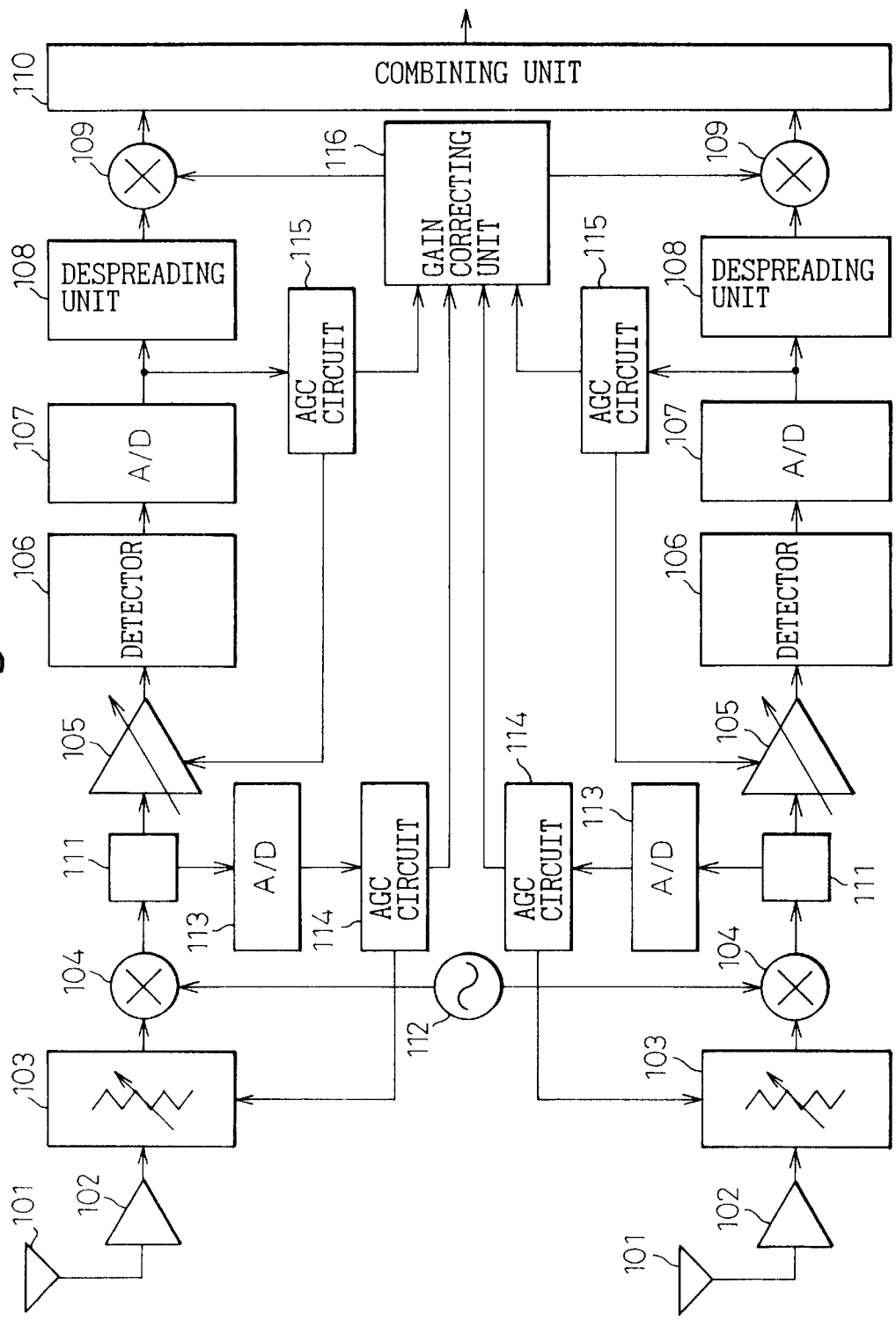
FIG. 8 shows a wireless receiver with an automatic gain control circuit in a conventional art.

FIG. 8 shows a wireless receiver with an automatic gain control circuit in a conventional art. This wireless receiver employs a space-diversity reception system with a CDMA (Code Division Multiple Access) method.

In the drawing, reference number 101 denotes an antenna, 102 a high frequency amplifier having low noise characteristics (below, low noise amplifier), 103 a variable attenuator, 104 a frequency converter, 105 a variable gain amplifier, 106 a detector, 107 an A/D converter (A/D), 108 a despreading unit, 109 a multiplier, 110 a combining unit, 111 a signal branch unit, 112 a local oscillator, 113 an A/D converter, 114 and 115 automatic gain control (AGC) circuits, and 116 a gain correcting unit for correcting the gain between branches.

The signal received by the antenna 101 is amplified by the low noise amplifier 102, input to the frequency converter 104 through the variable attenuator 103 which is controlled by the AGC circuit 114, mixed with the local oscillator signal from the local oscillator 112, and converted to the intermediate frequency signal. In the above process, the signal level is adjusted by the variable attenuator 103 in such a way that the frequency converter 104 is not saturated.

Further, the intermediate frequency signal is input to the variable gain amplifier 105, of which the gain is controlled by the AGC circuit 115, through the branch unit 111. Further, the signal level is adjusted by the variable gain amplifier 105 in such a way that the detector 106 is not saturated.

The detector 106 functions as a quadrature detector when the intermediate frequency signal is processed by the quadrature modulation, and outputs an I-channel signal and a Q-channel signal, modulated in quadrature each other, to the A/D converter 107. The A/D converter converts these I-channel and Q-channel signals to digital signals, and outputs the digital signals to the despreading unit 108. The despreading unit 108 demodulates the digital signals by using spreading codes, and outputs the demodulated signals to the combining unit 110 through the multiplier 109. The combining unit 110 combines the output signal of the first branch with the output signal with the second branch in order to obtain a combined signal between branches.

Further, the gain correcting unit 116 corrects the signal levels between the branches in accordance with the gain control signal from the AGC circuits 114 and 115. Accordingly, since the signal levels, which are demodulated by both despreading units 108, are approximately equal to one another in the gain correcting unit 16, and can be corrected to signal levels corresponding to the input signal level sent to the antenna 101 in the gain correcting unit 16, it is possible to realize the maximum ratio combination in the combining unit 110.

There are, however, some problems in the conventional wireless receiver with the automatic gain control circuit as explained in detail below.

That is, as shown in FIG. 8, two AGC circuits 114 and 115 are provided in order to perform the gain control by two steps. Concretely, the attenuator 103 of the preceding gain control unit is controlled by the AGC circuit 114, and the variable gain amplifier 105 of the following gain control unit is controlled by the AGC circuit 115.

Accordingly, since it is necessary to provide two AGC circuits, each having a similar structure one another, in order to perform the gain control in each branch, the circuit structure becomes large and complicated. As is obvious from the above explanations, the object of the present invention is to provide an automatic gain control circuit having a simplified circuit structure as described in detail with reference to FIGS. 1 to 7.

Figure 1:
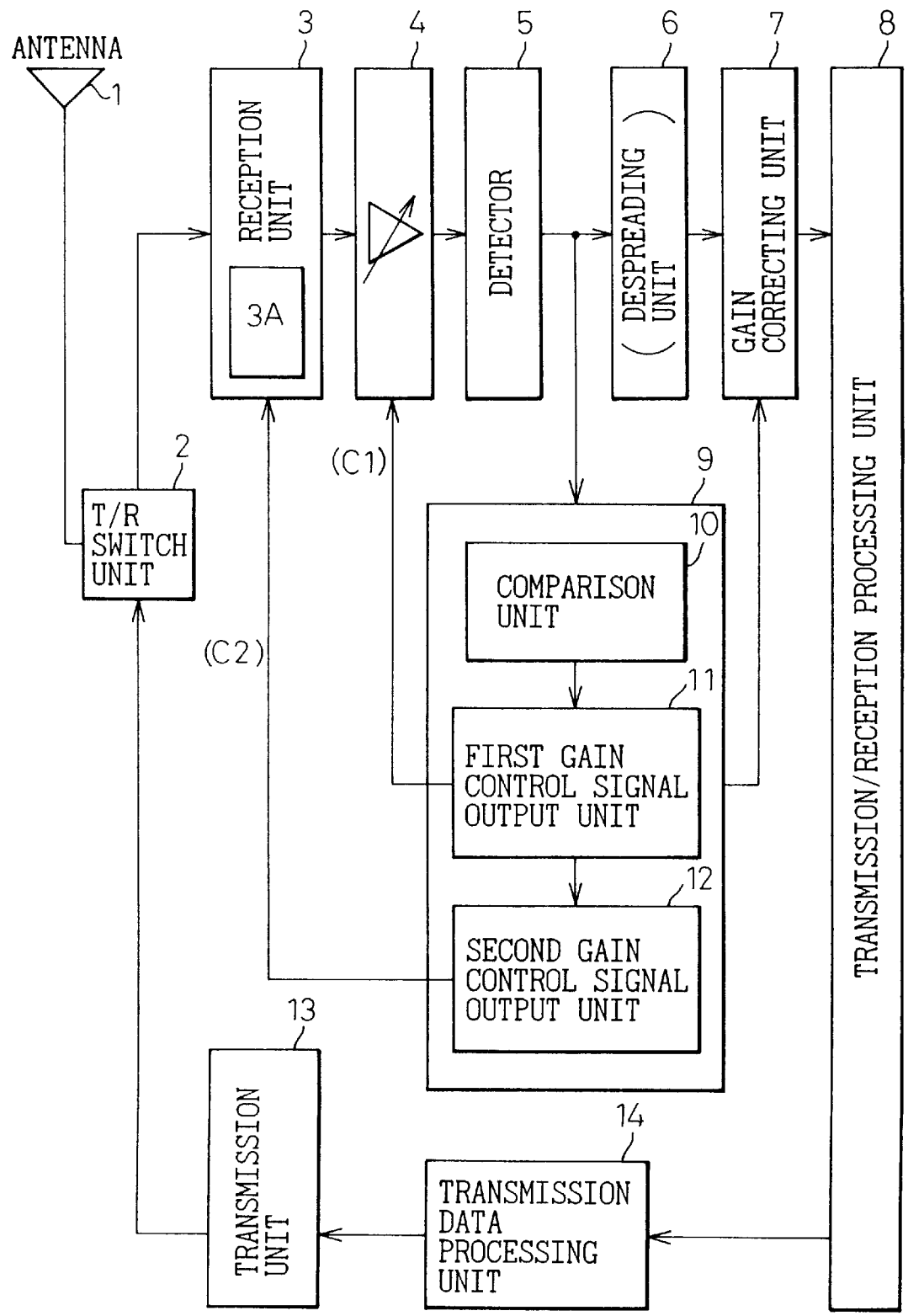
FIG. 1 is a basic block diagram of an automatic gain control circuit according to the present invention.

FIG. 1 is a basic block diagram of an automatic gain control circuit according to the present invention. In FIG. 1, reference number 1 denotes an antenna; 2 a transmission and reception (T/R) switch unit; 3 a reception unit including a preceding gain control unit 3A, a low noise amplifier, a frequency converter, etc.; 4 a following gain control unit including a variable gain amplifier; 5 a quadrature detector; 6 a despreading unit used for the CDMA method; 7 a gain correcting unit; 8 a transmission and reception processing unit including, a codec (i.e., coder and decoder), a speaker, a microphone, a data input unit, a data display unit, an output unit, etc.; 9 an automatic gain control (AGC) circuit; 10 a comparison unit; 11 a first gain control signal output unit; 12 a second gain control signal output unit; 13 a transmission unit including a transmission amplifier, a frequency converter, etc.; and 14 a transmission data processing unit.

Briefly, the signal received by the antenna 1 is controlled (i.e., amplified or attenuated) by the preceding gain control unit 3A in the reception unit 3 so as to become a predetermined level. Further, the frequency of the signal is converted by the frequency converter in the reception unit 3. Still further, after frequency conversion, the signal level is controlled again by the following gain control unit 4 so as to become a predetermined level.

The predetermined level is detected by the detector 5. The output from the detector 5 is demodulated by the despreading unit 6 when the CDMA method is employed. Further, the signal level of the demodulated signal is corrected by the gain correcting unit 7 and the corrected signal is input to the transmission and reception processing unit 8 in order to reproduce sound and data and to display the image.

Further, the AGC circuit 9 includes the comparison unit 10 and the first and second gain control signal output units 11 and 12. The comparison unit 10 compares a reference value (i.e., a value for determining an input level to the A/D converter) with the output signal from the following gain control unit 4 or the detected signal from the detector 5, and outputs a first gain control signal from the first gain control signal output unit 11 to the following gain control unit 4 in response to the result of comparison in the comparison unit 10 in order to control the gain of the following gain control unit 4.

Accordingly, since the gain of the following gain control unit 4 is controlled in response to the level fluctuation of the output signal from the detector 5, it is possible to control the gain of the following gain control unit 4 so as to suppress the instantaneous fluctuation of the signal levels which are input to the despreading unit 6.

The second gain control signal output unit 12 outputs a second gain control signal based on the gain of the following gain control unit 4 controlled by the first gain control signal output unit 11. For example, when the gain of the following gain control unit 4 is large, the gain of the preceding gain control unit 3A is set to the larger value since this indicates that the level of the input signal is small. In this case, when the variable attenuator is used as the preceding gain control unit, an amount of the attenuation in the variable attenuator is set to small value.

On the contrary, when the gain of the following gain control unit 4 is small, the gain of the preceding gain control unit 3A is set to the small value since this indicates that the level of the input signal is large. In this case, when the variable attenuator is used as the preceding gain control unit, an amount of the attenuation in the variable attenuator is set to a large value. In this case, the gain control at the preceding gain control unit 3A is performed corresponding to the characteristic which follows either the instantaneous fluctuation of the signal level or the long fluctuation having the term longer than the instantaneous fluctuation.

Figure 2:
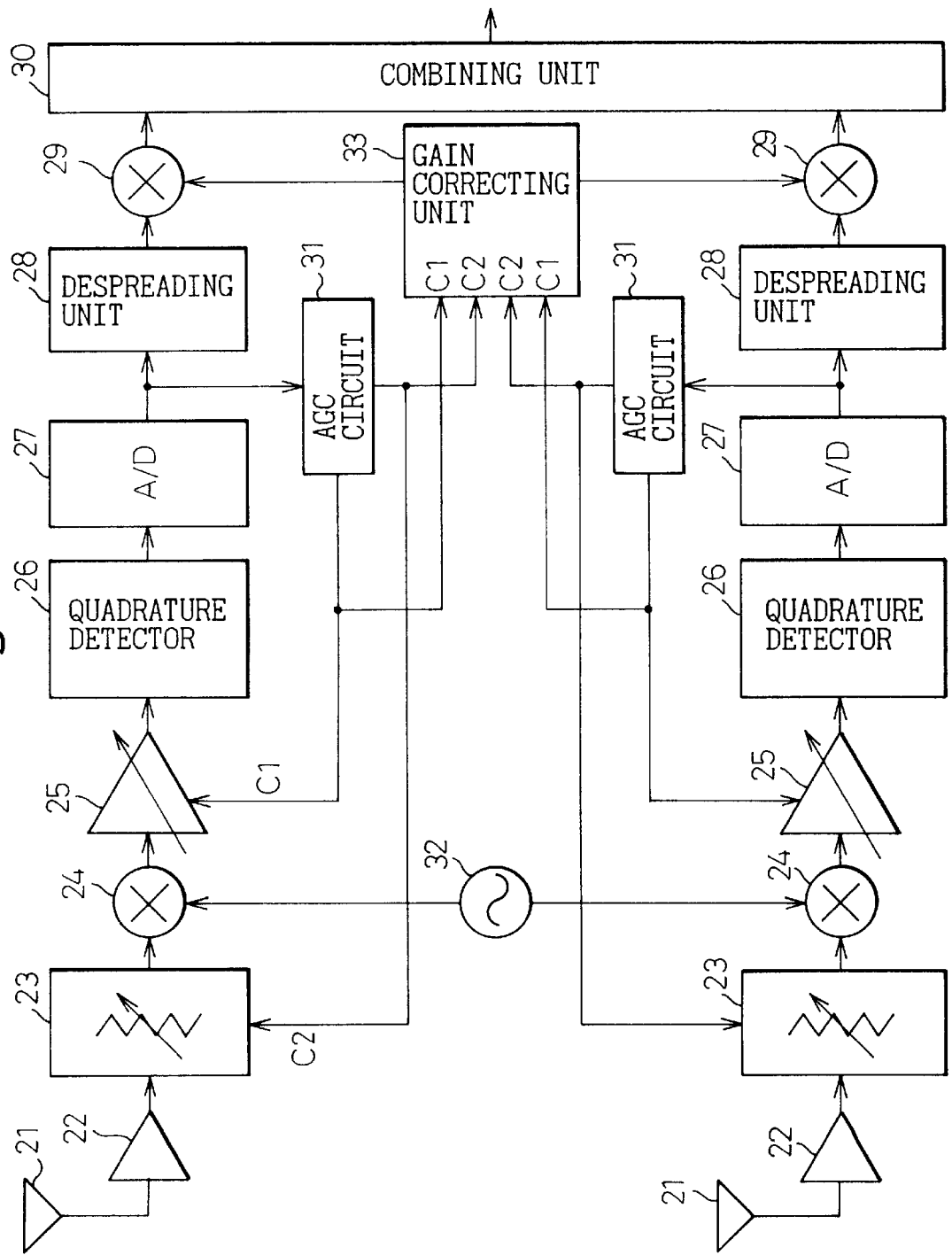
FIG. 2 is a block diagram of the automatic gain control circuit according to a first embodiment of the present invention.

FIG. 2 is a block diagram of the automatic gain control circuit according to a first embodiment of the present invention. In FIG. 2, reference number 21 denotes an antenna, 22 a low noise amplifier, 23 a variable attenuator, 24 a frequency converter, 25 a variable gain amplifier, 26 an quadrature detector, 27 an analog-to-digital (A/D) converter, 28 a despreading unit, 29 a multiplier, 30 a combining unit, 31 an automatic gain control (AGC) circuit, 32 a local oscillator, and 33 a gain correcting unit between branches.

The space diversity reception system with the CDMA method is used in this embodiment. Further, the variable attenuator 23 corresponds to the preceding gain control unit 3A in FIG. 1, and the variable gain amplifier 25 corresponds to the following gain control unit 4 in FIG. 1.

The AGC circuit 31 has the same structure as the automatic gain control circuit 9 in FIG. 1, and includes the comparison unit 10 and the first and second gain control signal output units 11 and 12. The output signal detected by the quadrature detector 6 is input to the AGC circuit 31 after the analog-to-digital conversion by the A/D converter 27.

Further, the AGC circuit 31 compares the converted signal with the reference value, outputs the first gain control signal from the first gain control signal output unit to the variable gain amplifier 25 in response to the result of comparison in the comparison unit, and outputs the second gain control signal from the second gain control signal output unit to the variable attenuator 23.

The variable attenuator 23 adjusts the amount of the attenuation of the input signal level in the range that the frequency converter 24 does not saturate. The variable attenuator 25 controls the gain of the output signal from the frequency converter 24 in such a way that the output signal from the detector 26 becomes a predetermined level.

As mentioned above, it is possible to adjust the control speed of the gain in such a way that the control speed for controlling the gain (i.e., amount of attenuation) of the variable attenuator 23 from the second gain control signal output unit of the AGC circuit 31 becomes slower than the control speed for controlling the gain of the variable gain amplifier 25 from the first gain control signal output unit. Further, it is possible to reduce the circuit structure by providing the AGC circuit 31 used in common for controlling the variable attenuator 23 and the variable gain amplifier 25.

The gain correction unit 33 receives the first gain control signal from the first gain control signal output unit of the AGC circuit 31 and the second gain control signal from the second gain control signal output unit of the AGC circuit 31, from each branch.

When the input signal level is small in one branch so that the gains of both the variable attenuator 23 and the variable gain amplifier 25 are increased, the signal level is reduced by the multiplier 29. On the other hand, when the input signal level is large in the other branch so that the gains of both the variable attenuator 23 and the variable gain amplifier 25 are educed, the signal level is increased by the multiplier 29. The combining unit 30 performs the maximum ratio combination (this combination is known and is performed to obtain the maximum S/N ratio between branches) based on the signal in which the gain was corrected between branches.

Figure 3:
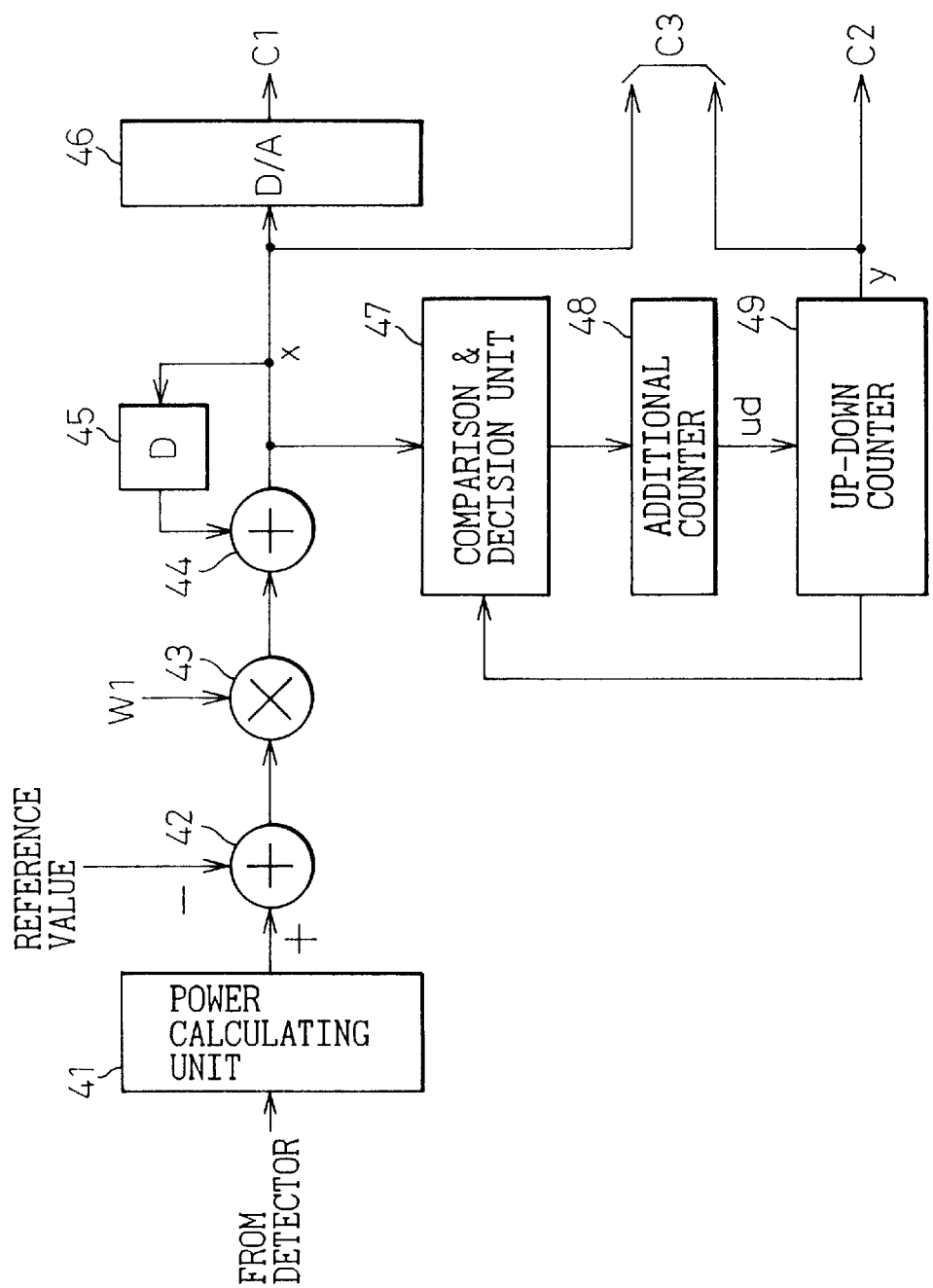
FIG. 3 is an essential explanatory view of the automatic gain control circuit according to a second embodiment of the present invention.

FIG. 3 is an essential explanatory view of the automatic gain control circuit according to a second embodiment of the present invention. In FIG. 3, reference number 41 denotes a power calculating unit, 42 an adder, 43 a multiplier, 44 an adder, 45 a delay circuit (D) for one symbol, 46 a digital-to-analog (D/A) converter, 47 a comparison and decision unit, 48 an additional counter, and 49 an up-down counter.

The power calculating unit 41 receives the detected output signal from the detector 5 of FIG. 1 or from the quadrature detector 26 of FIG. 2. In this case, the comparison unit 10 of FIG. 1 corresponds to the power calculating unit 41, the adder 42 and the multiplier 43. Further, the first gain control signal output unit 11 of FIG. 1 corresponds to the adder 44, the delay circuit 45 and the D/A converter 46. Still further, the output C1 from the D/A converter 46 corresponds to the first gain control signal which is added to the following gain control unit 4 of FIG. 1 or the variable gain amplifier 25 of FIG. 2.

The second gain control signal output unit 12 of FIG. 1 corresponds to the comparison and decision unit 47, the additional counter 48 and the up-down counter 49. Further, the output C2 from the up-down counter 49 corresponds to the second gain control signal which is added to the preceding gain control unit 3A of FIG. 1 or the variable attenuator 23 of FIG. 2. Still further, the gain control signal 3C is formed by the digital gain control signals C1 (i.e., signal before D/A conversion) and the gain control signal C2, and is added to the gain correcting unit 33 of FIG. 2.

The power calculating unit 41 receives the I-signal and the Q-signal from the quadrature detector 26, calculates the power by the symbol speed in accordance with the calculation, for example, $10 \log_{10} (I^2 + Q^2)$, and compares the reference value with the signal corresponding to the detected output signal level. In this embodiment, as shown in FIG. 3, the difference between the reference signal and the detected output signal is calculated in the adder 42.

The difference signal which is output signal from the adder 42 is input to the multiplier 43. In the multiplier 43, a weighted factor W1 is multiplied to the difference signal, and the multiplied signal is output to the adder 44. In this case, the level of the multiplied signal is adjusted so as not to saturate in the adder 44. In this case, the weighted factor W1 means a time constant for determining sensitivity of response at the gain control unit when the difference signal is output to the gain control unit.

As shown in the drawing, the adder 44 and delay circuit 45 constitutes an integrator. In the integrator, the average value at the delay circuit 45 is calculated for the output signal of the multiplier 43. The calculated signal, i.e., the output signal "x" from the integrator is converted to the analog signal by the D/A converter 46, and the analog signal is output therefrom as the first gain control signal C1.

In this case, when the signal level is high, the analog gain control signal C1 corresponding to this high level is output to the following gain control unit 4 or the variable gain amplifier 25 in order to reduce the gain thereof. That is, the following gain control unit 4 or the variable gain amplifier 25 is controlled so as to reduce the gain. On the other hand, when the signal level is low, the analog gain control signal C1 corresponding to this low level is output to the following gain control unit 4 or the variable gain amplifier 25 in order to increase the gain thereof.

That is, the following gain control unit 4 or the variable gain amplifier 25 is controlled so as to increase the gain. In this case, the gain of the following gain control unit 4 or the variable gain amplifier 25 can be controlled in the range of 0 to 50 dB.

Further, when the power calculating unit 41 operates at the symbol speed of the CDMA method, and when the delay circuit 45 is set to the delay time of one symbol, it is possible to control the gain of the preceding gain control unit 3A or the variable gain amplifier 25 so as to follow the instantaneous fluctuation of the signal level.

Further, the comparison and decision unit 47 compares the output signal "x" of the integrator with setting values α and β which are provided for comparing the output signal "x" with these setting values in order to control the preceding gain control unit. The setting values α and β are selected so as to become the relationship of β>x>α, when the output signal "x" indicates the desired output signal level. Further, it is possible to control the gain (amount of attenuation) of the preceding gain control unit 3A or the variable attenuator 23 by sixteen steps each having 2 dB in response to the output signal "y" at the counted value from 0 to 15 in the up-down counter 49.

In this case, when α>x, and y≠15, that is, when the output signal "x" is smaller than the setting value α, and when the up-down counter 49 does not indicate the maximum count value, the comparison and decision unit 47 outputs the value "1". On the other hand, when B<x, and y≠0, that is, when the output signal "x" is larger than the setting value β, and when the up-down counter 49 does not indicate the minimum count value, the comparison and decision unit 47 outputs the value "−1". In other cases, the comparison and decision unit 47 outputs the reset signal.

The additional counter 48 is formed by, for example, an up-down counter having an initial value "15", and counts in response to the output signal "+1" or "−1" from the comparison and decision unit 47. For example, when a state of α>x is continued, and when the counted value exceeds "31" in the up-count operation, the additional counter 48 reaches the overflow state and outputs "+1" at that time. After output of "+1", the additional counter 48 is reset to the initial value "15".

On the other hand, when the state of β<x is continued, and when the counted value becomes "0" in the down-count operation, the additional counter 48 reaches the underflow state and outputs "−1" at that time. After output of "−1", the additional counter 48 is reset to the initial value "15". As mentioned above, the additional counter 48 sets the output signal "ud", which is added to the up-down counter 49, to "+1" at the overflow state, or to "−1" at the underflow state.

The up-down counter 49 starts an up count operation in response to "+1" of the output signal "ud" at the overflow state of the additional counter 48, and performs a down count operation in response to "−1" of the output signal "ud" at the under flow of the additional counter 48. Further, the up-down counter 49 outputs the counted value "y" to the comparison and decision unit 47, and also outputs "y" to the gain control unit 3A (see FIG. 1) or the variable attenuator 23 (see FIG. 2) as the gain control signal C2.

Accordingly, when the output signal "x" is large, i.e., when β<x, the additional counter 48 starts a down count operation. When the down count operation is continued, the up-down counter 49 performs a down count operation in response to the output signal "ud" from the additional counter 48. Since the counted value is reduced, the up-down counter 49 outputs the second gain control signal C2 so that the amount of attenuation of the variable attenuator 23 becomes small.

On the other hand, when the output signal "x" is small, i.e., when α>x, the additional counter 48 performs an up count operation. When the up count operation is continued, the up-down counter 49 performs an up count operation in response to the output signal "ud" from the additional counter 48. Since the counted value is increased, the up-down counter 49 outputs the second gain control signal C2 so that the amount of attenuation of the variable attenuator 23 becomes large.

In this case, the gain (i.e., amount of attenuation) is controlled stepwise in 2 dB intervals, in the range from 0 to 32 dB. Further, when the counted value is "0", the counted value "0" is maintained even if the output signal "ud" from the additional counter 48 is "−1". Similarly, when the counted value is, for example, the maximum value "15", the counted value "15" is maintained even if the output signal "ud" from the additional counter 48 is "+1".

Accordingly, the gain of the following gain control unit 4 or the variable gain amplifier 25 can be controlled by the gain control signal C1 having approximately the symbol speed in the CDMA method. On the other hand, the gain of the preceding gain control unit 3A or the variable attenuator 23 is controlled by the gain control signal C2 having the characteristic which follows the fluctuation having a long term based on the additional counter 48.

Further, the gain control signal C3 is obtained by the output signal "x" of the integrator and the counted value "y" of the up-down counter 49, and is added to the gain correcting unit 33 of FIG. 2. Still further, it is possible to have a structure in which each unit has a digital signal processing structure and is structured by the calculation processing function.

Figure 4:
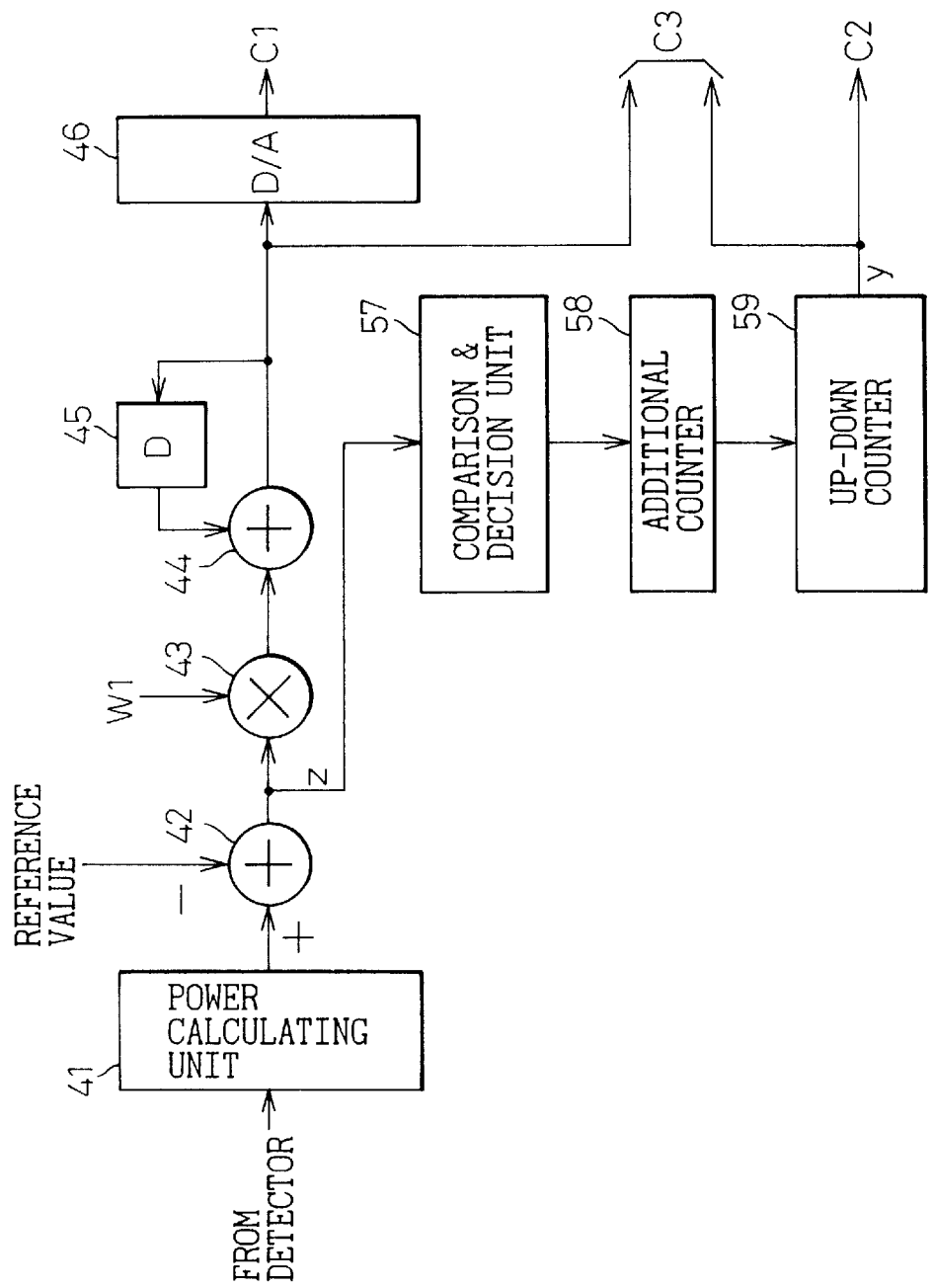
FIG. 4 is an essential explanatory view of the automatic gain control circuit according to a third embodiment of the present invention.

FIG. 4 is an essential explanatory view of the automatic gain control circuit according to a third embodiment of the present invention. In FIG. 4, the same reference numbers used in FIG. 3 are attached to the same components in this drawing. The reference number 57 denotes a comparison and decision unit, 58 an additional counter, and 59 an up-down counter. The D/A converter 46 outputs the first gain control signal C1 which is added to the following gain control unit 4 of FIG. 1 or the variable gain amplifier 25 of FIG. 2.

The comparison and decision unit 57 receives the difference signal "z" from the adder 42, and compares the difference signal "z" with the value "0". When 0>z, the comparison and decision unit 57 outputs "+1" to the additional counter 58. When 0<z, the comparison and decision unit 57 outputs "−1" to the additional counter 58. The additional counter 58 starts an up count or a down count operation in response to the outputs "+1" or "−1" from the comparison and decision unit 57, and outputs "+1" when the counter 58 reaches an overflow state, and outputs "−1" when the counter 58 reaches an underflow state. After outputs to the up-down counter 59, the additional counter 58 is rest to an initial value (i.e., center value).

The up-down counter 59 performs the same operation as the up-down counter 49 of FIG. 3. That is, the up-down counter 59 outputs the second gain control signal C2 to the preceding gain control unit 3A of FIG. 1 or the variable attenuator 23 of FIG. 2 in order to perform stepwise control of the gain. When the counted value is large, the gain is increased (i.e., the amount of attenuation is reduced), and when the counted value is small, the gain is reduced (i.e., the amount of attenuation is increased).

Accordingly, when the input signal level is high, since the difference signal "z" becomes larger than "0" and the output level of the integrator becomes large, the first gain control signal C1 is output from the D/A converter 46 so that the gain control unit 4 of FIG. 1 or the variable gain amplifier 25 of FIG. 2 is reduced. As a result, the gain control is performed so as to suppress the instantaneous fluctuation of the signal level.

Further, when a state in which the difference signal "z" becomes larger than "0" is continued, the additional counter 58 continues the down count operation so that it reaches an underflow state. As a result, the up-down counter 59 performs a down count operation so that the counted value is reduced. Accordingly, the gain control signal C2 is output from the up-down counter 59 in the direction that the gain of the preceding gain control unit 3A or the variable attenuator 23 is reduced (i.e., the amount of attenuation) is increased, and the gain control is performed so as to suppress the fluctuation for a long term.

In this case, for example, since the gain control is performed in accordance with the fluctuation having the long term, it is possible to control the gain of the preceding gain control unit 3A or the variable attenuator 23 by using a random walk filter (i.e., an up-down counter).

Figure 5:
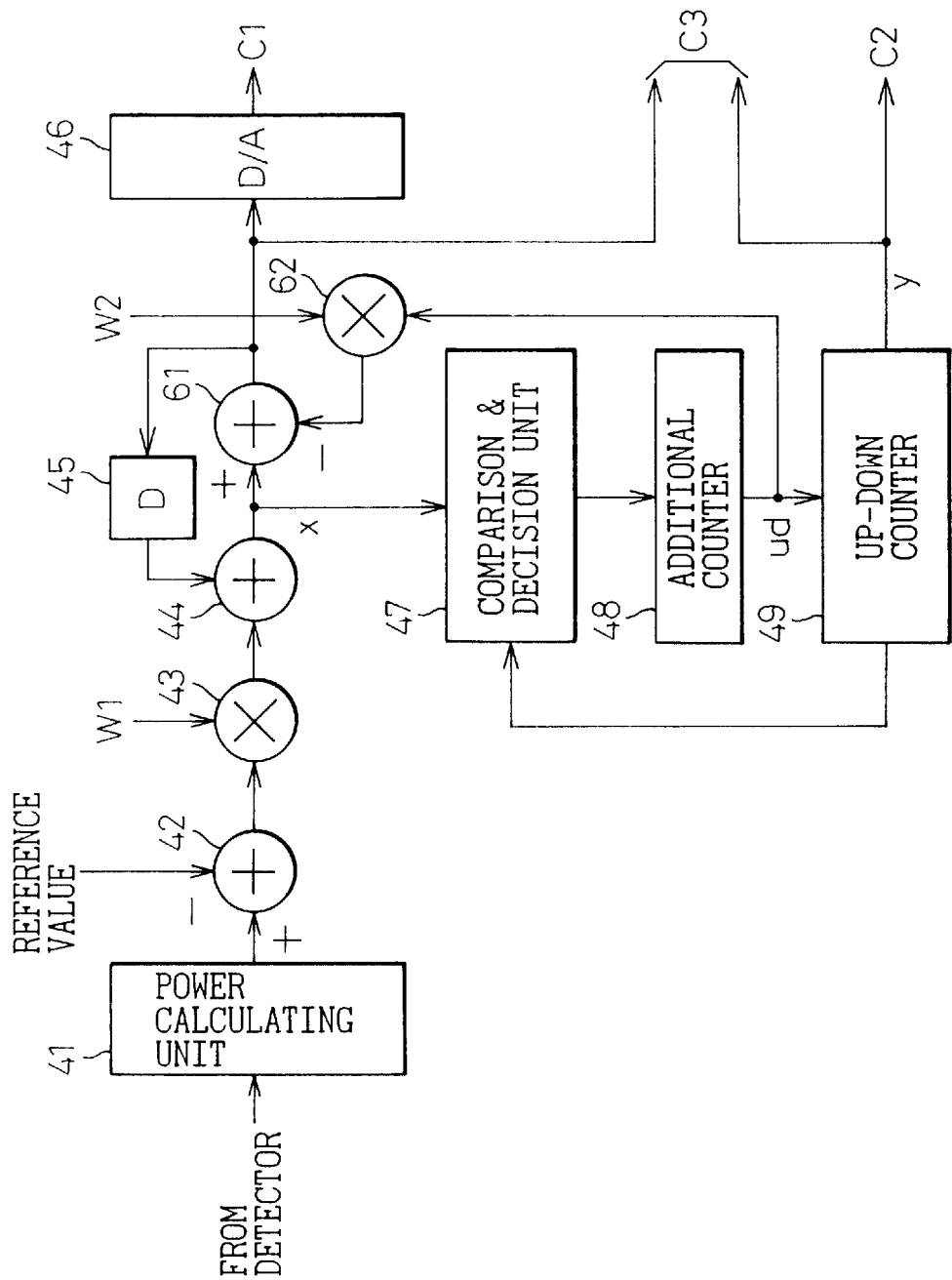
FIG. 5 is an essential explanatory view of the automatic gain control circuit according to a fourth embodiment of the present invention.

FIG. 5 is an essential explanatory view of the automatic gain control circuit according to a fourth embodiment of the present invention. In FIG. 5, reference number 61 denotes an adder, 62 a multiplier, and W2 a weighted factor. The weighted factor W2 is used for correcting the difference of resolution between signals which control the preceding and following gain control units. A fluctuation correcting unit is formed by the multiplier 62 for multiplying the weighted factor W2 and the adder 61. As is obvious from the drawing, the fluctuation correcting unit is added to the structure of the second embodiment shown in FIG. 3.

As mentioned above, the gain of the following gain control unit 4 or the variable gain amplifier 25 is controlled by following the instantaneous fluctuation, and the gain of the preceding gain control unit 3A and the variable attenuator 23 is controlled by following the fluctuation having the long term. Accordingly, when the gain control is performed in the preceding gain control unit 3A or the variable attenuator 23, the gain of the following gain control unit 4 or the variable gain amplifier 25 is controlled in response to the instantaneous fluctuation so that the following gain control unit 4 or the variable gain amplifier 25 operates so as to cancel the gain control at the preceding gain control unit 3A and the variable attenuator 23.

Accordingly, by using the fluctuation correcting unit including the adder 61 and the multiplier 62, the fluctuation of the gain in the preceding gain control unit 3A or the variable attenuator 23 is adjusted in conjunction with the gain control signal C1 which is used for controlling the gain of the following gain control unit 4 or the variable gain amplifier 25, in order to improve the automatic gain control characteristics in the whole of the circuit.

That is, since the output signal "ud" from the additional counter 48 becomes "+1" or "−1" so that the gain control signal C2 is changed, the output signal "ud" is added from the additional counter 48 to the multiplier 62 and multiplied by the weighted factor W2 in the multiplier 62, and the output of the multiplier 62 is added to the adder 61 in order to subtract from the output signal "x".

For example, when the output signal "x" is large and reaches the state of β<x, the additional counter 48 starts a down count operation. When the down count operation is continued, and when the additional counter 48 reaches an underflow state, the output signal "ud" from the additional counter 48 becomes "−1", and the up-down counter 49 starts the down count operation so that the gain control signal C2 changes. As a result of a change in the gain control signal, the gain of the preceding gain control unit 3A or the variable attenuator 23 is controlled by the gain control signal C2 so as to become larger (i.e., the amount of attenuation is small). As a result, since the signal level becomes high, the output signal "x" becomes high.

At that time, since the output signal "ud" of the additional counter 48 is multiplied by the weighted factor W2, and the multiplied output signal (in this case, since the output signal "ud" is −1, the multiplied output signal becomes negative) is subtracted from the output signal "x", it is possible to output the gain control signal having the previous state by correcting the change of the value of the gain control signal C1.

On the contrary, when the output signal is small and reaches the state of α>x, the additional counter 48 starts an up count operation. When the up count operation is continued, and when the additional counter 48 reaches an overflow state, the output signal "ud" of the additional counter 48 becomes +1. Further, the up down counter 49 starts up count operation so that the gain control signal C2 changes so as to make the amount of the variable attenuator 23 large.

As a result of change of the gain control signal C2 the output signal "x" changes so as to become small. In this case, by multiplying one of the output signals of the additional counter 48 by the weighted factor W2, and by subtracting weighted output signal from the output signal "x", it is possible to correct the change of the value of the gain control signal C1 and to output the gain control signal C1 having the previous state.

Figure 6:
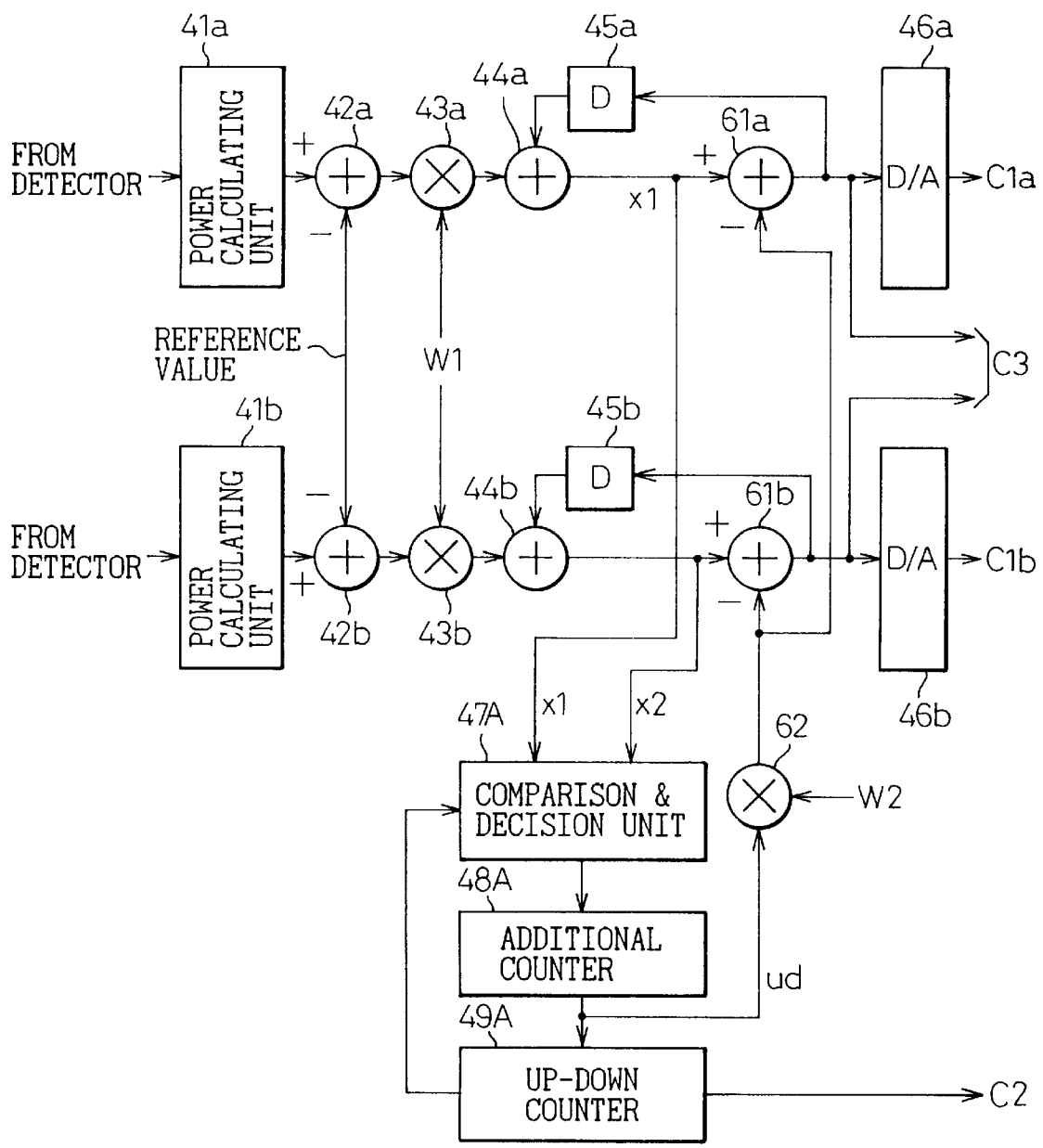
FIG. 6 is an essential explanatory view of the automatic gain control circuit according to a fifth embodiment of the present invention.

FIG. 6 is an essential explanatory view of the automatic gain control circuit according to a fifth embodiment of the present invention. In FIG. 6, reference numbers 41a and 41b denote power calculating units, reference numbers 42a and 42b denote adders each comparing the input signal with the reference value, and reference numbers 43a and 43b denote multipliers each multiplying the weighted factor W1.

Further, 44a and 44b are adders, 45a and 45b are delay circuits, 46a and 46b are digital-to-analog converters (D/A), 47A is a comparison and decision unit, 48A is an additional counter, 49A is an up-down counter, and 61a and 61b are adders.

Still further, reference number 62 denotes a multiplier for multiplying the weighted factor W2, C1a and C1b denote gain control signals each added to the following gain control unit 4 (see FIG. 1) or the variable gain amplifier 25 (see FIG. 2), C2 denotes the gain control signal added to the preceding gain control unit 3A (see FIG. 1) or the variable attenuator 23 (see FIG. 2), and C3 denotes the control signal added to the gain correcting unit 33 used for correcting the gain between the branches.

In this embodiment, as well as the previous embodiments, the adder 42a (42b) compares the power calculated by the power calculation unit 41 (41b) with the reference value, and the multiplier 43a (43b) multiply the difference signal from the adder by the weighted factor W1. Further, the output signal "x1" (x2) of the integrator, which is formed by the delay circuit 45a (45b) at delay time for one symbol and the adder 44a (44b), is input to the DA converter 46a (46b) through the adder 61a (61b).

The adder 61a (61b) outputs the analog gain control signal C1a (C1b) to the following gain control unit or the variable gain amplifier for each branch. In this case, the corrected gain control signal C1a (C1b) can be obtained by the fluctuation correcting unit including adder 61a (61b) and the multiplier 62.

Further, the comparison and decision unit 47A receives the output signals "x1" and "x2", and outputs "+1" when the value counted by the up-down counter 49A becomes α>x1 or α>x2, and when it is not "15". Further, the comparison and decision unit 47A outputs "−1" when the value counted by the up-down counter 49A becomes β<x1 or β<x2, and when it is not "0". Except for the above states of the counted value, the comparison and decision unit 47A outputs the reset signal.

The additional counter 48A and the up-down counter 49A operate as well as the additional counter 48 and the up-down counter 49 shown in FIG. 5. The counted value of the up-down counter 49A is used as the gain control signal C2 of the preceding gain control unit 3A or the variable attenuator 23 in both branches. Further, the gain control signals C1a and C1b are used as the control signal C3 for the gain correcting unit provided between branches.

The additional counter 48A performs up an count operation when "+1" is output from the comparison and decision unit 47A, performs down count operation when "−1" is output from the comparison and decision unit 47A, and is reset to the initial value when the reset signal is output from the comparison and decision unit 47A. For example, when the counted value indicates from 0 to 31, the additional counter 48A is rest to the initial value "15".

Further, when the up count operation is continued so that the additional counter 48A reaches an overflow state, the additional counter 48A outputs "+1" in order to reset itself. When down count operation is continued so that the additional counter 48A reaches underflow state, the additional counter 48A outputs "−1" in order to reset itself.

The up-down counter 49A performs an up count operation based on the output signal "+1" from the additional counter 48A, and performs down count operation based on "−1". The counted value is used as the gain control signal C2 of the following gain control unit 3A or the variable attenuator 23. In this case, the output signal from the additional counter 48A is multiplied by the weighted factor W2, and the multiplied output signal is subtracted from the output signals "x1" and "x2" in the adders 61a and 61b. As a result, the amount of fluctuation is corrected based on the control of the gain (i.e., amount of attenuation) for the preceding gain control unit 3A or the variable attenuator 23.

Accordingly, since it is possible to use in common the second gain control signal output unit, which includes the comparison and decision unit 47A, the additional counter 48A and the up-down counter 49A, between branches, it is possible to reduce the circuit size.

Figure 7:
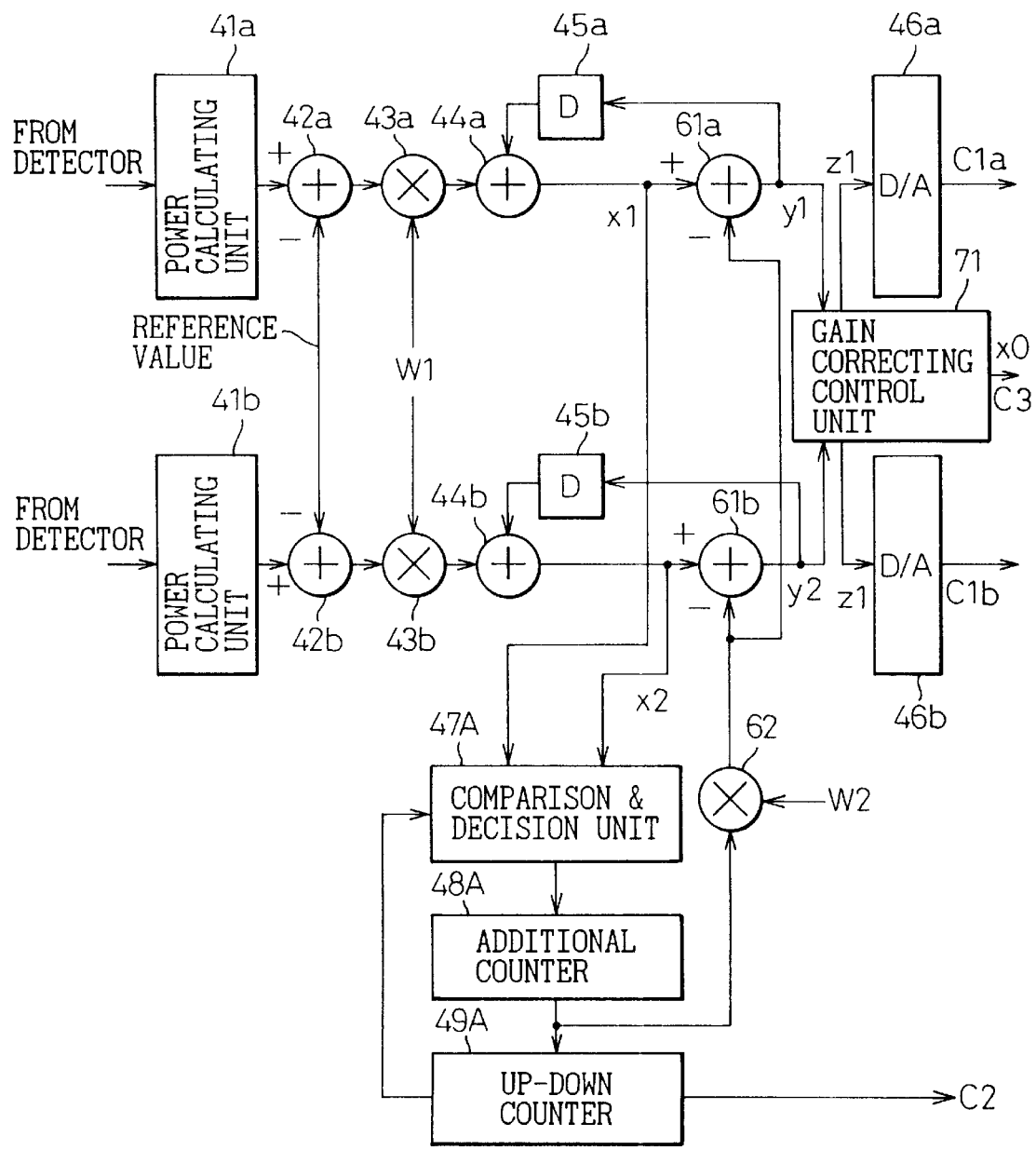
FIG. 7 is an essential explanatory view of the automatic gain control circuit according to a sixth embodiment of the present invention.

FIG. 7 is an essential explanatory view of the automatic gain control circuit according to a sixth embodiment of the present invention. The same reference numbers used in FIG. 6 are used for the same components in this drawing. Reference number 71 denote a gain correcting control unit. In this embodiment, the output signals "y1" and "y2" from the adders 61a and 61b of the fluctuation correcting unit are input to the gain correcting control unit 71, the signals "z1" and "z2" are output as the gain control signals C1a and C1b used for the following gain control unit 3A or the variable gain amplifier 25. Further, the signal "x0" is output as the control signal C3 used for gain correction between the branches.

When y1>y2, the gain correcting control unit 71 outputs the following signals, i.e., z1=(int)[(y1−y2)/Y+0.5]* Y+y2 z2=y2 x0=(int)[(y1−y2)/Y+0.5]

When y1<y2, the gain correcting control unit 71 outputs the following signals, i.e., z1=y1 z2=(int)[(y2−y1)/Y+0.5]* Y+y1 x0=(int)[(y2−y1)/Y+0.5]

In this case, one signal having a smaller level in two output signals "y1" and "y2" is used as the reference value, and the other signal is calculated and output. The letter (int) denotes an integer calculation, and the result of calculation is cut-off. Accordingly, the value 0.5 is used for rounding to the nearest whole number. Further, when the dynamic range of the variable gain amplifier 25 is 50 dB, and the number of bits of the D/A converter 46 is eight, the Y can be expressed by the formula $Y=20 \log_{10} (2)/(50/20^8)$.

In this case, when the difference of the gain between the branches is a power of 2, the gain correction between the branches can be performed in accordance with bit shift based on the number of the power. For example, it is possible to provide the structure which bit-shifts the multiplier 29 of FIG. 2 to one of the branches in accordance with the control signal from the gain correcting unit 33.

Further, when controlling the preceding gain control unit 3A or the variable attenuator 23 in accordance with each gain control signal for each branch, it is possible to realize the gain correction between the branches by using the bit shift by controlling the difference of gain between the branches so as to become a power of 2.

The present invention is not limited in the scope of embodiments mentioned above, and it is possible to provide various structures in the scope of the present invention. For example, as the preceding gain control unit 3A, it is possible to use a variable attenuator or variable gain amplifier which can continuously control an amount of attenuation instead of the variable attenuator 23 which controls the amount of attenuation stepwise.

Further, various structures can be applied to the power calculation unit if it has a structure which can detect a level of another input signal. Still further, the present invention can be applied to various wireless systems apart from the CDMA method which includes a structure having a two-step gain control unit, i.e., the preceding and following gain control units.

As mentioned above, the present invention discloses the automatic gain control circuit having a structure which can control, in common, the gain of the preceding gain control unit 3A and the following gain control unit 4. Accordingly, it is possible to reduce the circuit structure compared to the conventional structure which separately provides the preceding gain control unit and the following gain control unit.

Furthermore, in the structure having a plurality of branches, it is possible to provide the structure in which the first gain control signal output unit, which is arranged for the gain control of the following stage in each branch, is provided for each branch, and the second gain control signal output unit, which is arranged for the preceding gain control unit, is used in common between the branches.

What is claimed is:

1. An automatic gain control circuit for controlling a preceding gain control unit and a following gain control unit, said circuit comprising:

a comparison unit for comparing a signal level from said following gain control unit with a reference value;

a first gain control signal output unit for outputting a first gain control signal to said following gain control unit in response to an output signal obtained as a result of comparison in said comparison unit; and a second gain control signal output unit for outputting a second gain control signal to said preceding gain control unit, and said second gain control signal having a time constant longer than that of said first gain control signal output unit, in response to said output signal obtained as the result of comparison in said comparison unit.

2. An automatic gain control circuit as claimed in claim 1, wherein said second gain control signal output unit comprises an up-down counter for controlling up and down count operations, in response to a result of comparison of a setting value with said output signal obtained as the result of comparison in said comparison unit, and for outputting said second gain control signal to said preceding gain control unit in response to values counted by said up-down counter.

3. An automatic gain control circuit as claimed in claim 2, wherein said second gain control signal output unit further comprises an additional counter and a comparison and decision unit; said additional counter outputting an up count signal from said up-down counter when said additional counter overflows, and outputting a down-count signal from said up-down counter when said additional counter underflows; and said comparison and decision unit outputting the up-count signal or down-count signal of said additional counter in response to the output signal from said comparison and decision unit, the setting value and the values counted by said up-down counter.

4. An automatic gain control circuit as claimed in claim 1, further comprising a fluctuation correcting unit for controlling so as to suppress the change in the first gain control signal from said first gain control signal output unit, the change being based on a result of gain control for said preceding gain control unit in response to the counted value in said up-down counter when the counted value in said up-down counter is changed.

5. An automatic gain control circuit as claimed in claim 1, wherein said following gain control unit provided for each branch, is controlled by the first gain control signal from said first gain control signal output unit provided for each branch, and said preceding gain control unit provided for each branch is controlled by the second gain control signal from said second gain control signal output unit provided in common for a plurality of branches.

6. An automatic gain control circuit as claimed in claim 1, wherein either said first gain control signal output unit or said second gain control signal output unit controls each of or both the preceding and the following gain control units in such a way that a difference of the gain between the plurality of branches becomes a power of 2.

* * * * *